US010934633B2

United States Patent
Lu et al.

(10) Patent No.: US 10,934,633 B2
(45) Date of Patent: Mar. 2, 2021

(54) MULTI-ZONE VARIABLE POWER DENSITY HEATER APPARATUS CONTAINING AND METHODS OF USING THE SAME

(71) Applicant: Momentive Performance Materials Inc., Waterford, NY (US)

(72) Inventors: Zhong-Hao Lu, Twinsburg, OH (US); Rohit Arun Bhosale, Westlake, OH (US); Jacqueline M. More, Brunswick, OH (US); Sudarshan Natarajan, Solon, OH (US); Joseph Patrick Reyes, Hinkley, OH (US)

(73) Assignee: MOMENTIVE PERFORMANCE MATERIALS INC., Waterford, NY (US)

( * ) Notice: Subject to any disclaimer, the term of this patent is extended or adjusted under 35 U.S.C. 154(b) by 0 days.

(21) Appl. No.: 15/119,143

(22) PCT Filed: Feb. 20, 2015

(86) PCT No.: PCT/US2015/016733
§ 371 (c)(1),
(2) Date: Aug. 16, 2016

(87) PCT Pub. No.: WO2015/127157
PCT Pub. Date: Aug. 27, 2015

(65) Prior Publication Data
US 2017/0022630 A1    Jan. 26, 2017

Related U.S. Application Data

(60) Provisional application No. 61/942,904, filed on Feb. 21, 2014, provisional application No. 62/000,189, filed on May 19, 2014.

(51) Int. Cl.
*H05B 3/26* (2006.01)
*C30B 11/00* (2006.01)
(Continued)

(52) U.S. Cl.
CPC .......... *C30B 11/003* (2013.01); *C30B 11/002* (2013.01); *C30B 11/02* (2013.01);
(Continued)

(58) Field of Classification Search
CPC ........ H05B 2203/013; H05B 2203/037; C30B 11/003; C30B 35/002; Y10T 29/49083
See application file for complete search history.

(56) References Cited

U.S. PATENT DOCUMENTS

| 6,176,924 B1 | 1/2001 | Duval et al. | |
| 2002/0079311 A1* | 6/2002 | Bulgajewski | ............ H05B 3/26 |
| | | | 219/548 |

(Continued)

FOREIGN PATENT DOCUMENTS

| DE | 10246567 | 12/2003 |
| EP | 2028292 | 2/2009 |

(Continued)

OTHER PUBLICATIONS

European Patent Office, English computer translation of JP2013118088 (2017).*

(Continued)

*Primary Examiner* — Matthew J Song
(74) *Attorney, Agent, or Firm* — McDonald Hopkins LLC

(57) ABSTRACT

A heater comprises a plurality of zones with at least two zones having a variable power density gradient different from one another. The heater having zones of different variable power density gradients allows for controlling the heat output and temperature profile of the heater in one or more directions of the heater. The heater can be used, for example, to control the temperature profile in a vertical direction.

22 Claims, 7 Drawing Sheets

(51) Int. Cl.
 H05B 3/12 (2006.01)
 C30B 11/02 (2006.01)
 C30B 29/42 (2006.01)
(52) U.S. Cl.
 CPC ............. C30B 29/42 (2013.01); H05B 3/12 (2013.01); H05B 3/26 (2013.01); *H05B 2203/005* (2013.01); *H05B 2203/013* (2013.01); *H05B 2203/037* (2013.01); *Y10T 29/49083* (2015.01)

(56) References Cited

U.S. PATENT DOCUMENTS

| | | | |
|---|---|---|---|
| 2003/0145782 A1 | 8/2003 | Kawase et al. | |
| 2006/0137402 A1 | 6/2006 | Eichholz et al. | |
| 2007/0241096 A1* | 10/2007 | Kimura | H01L 21/67103 219/433 |
| 2007/0266931 A1* | 11/2007 | Mueller | C30B 11/003 117/83 |
| 2007/0289526 A1* | 12/2007 | Morikawa | C30B 25/02 117/88 |
| 2008/0017628 A1* | 1/2008 | Yudovsky | F27B 17/0025 219/390 |
| 2008/0029195 A1* | 2/2008 | Lu | H05B 3/143 156/1 |
| 2009/0133617 A1* | 5/2009 | Iida | C30B 15/14 117/35 |
| 2009/0250007 A1* | 10/2009 | Kim | C23C 14/243 118/726 |
| 2009/0320745 A1 | 12/2009 | D'Evelyn | |
| 2010/0116196 A1 | 5/2010 | Liu | |
| 2015/0053667 A1* | 2/2015 | Kushihashi | C23C 14/14 219/541 |
| 2017/0127476 A1* | 5/2017 | Lu | H05B 3/06 |

FOREIGN PATENT DOCUMENTS

| | | | |
|---|---|---|---|
| JP | 2004-217503 | 8/2004 | |
| JP | 2007-284343 | 11/2007 | |
| JP | 2008-239480 | 10/2008 | |
| JP | 2009-543996 | 12/2009 | |
| JP | 2013118088 A * | 6/2013 | ............. H05B 3/10 |
| KR | 20020071412 A * | 9/2002 | ............. C03B 11/00 |

OTHER PUBLICATIONS

European Patent Office, English computer translation of KR100428699 which is also published as KR 2002-0071412 (2018). (Year: 2018).*
International Search Report and Written Opinion of the International Searching Authority for PCT/US2015/016733 dated Jun. 1, 2015.

* cited by examiner

MULTI-ZONE VARIABLE POWER DENSITY HEATER APPARATUS CONTAINING AND METHODS OF USING THE SAME

CROSS REFERENCE TO RELATED APPLICATIONS

The present application claims priority to and the benefit of International Application No. PCT/US2015/016733, titled "MULTI-ZONE VARIABLE POWER DENSITY HEATER APPARATUS CONTAINING AND METHODS OF USING THE SAME" filed on Feb. 20, 2015, which claims priority to and the benefit of U.S. Provisional Application No. 61/942,904 titled "MULTI-ZONE VARIABLE POWER DENSITY HEATER APPARATUS CONTAINING AND METHODS OF USING THE SAME" filed on Feb. 21, 2014, and U.S. Provisional Application No. 62/000,189 titled "MULTI-ZONE VARIABLE POWER DENSITY HEATER APPARATUS CONTAINING AND METHODS OF USING THE SAME" filed on May 19, 2014; the disclosure of each of which is incorporated herein by reference in its entirety.

FIELD

The technology relates to a heater design, containers comprising such heaters, and methods of processing materials utilizing such heaters and/or containers comprising such heaters.

BACKGROUND

In vertical gradient freeze (VGF) crystal growth processes, the contents of a crucible are heated, and a temperature gradient is created to create a cool zone and allow the crystal to freeze and grow. This requires a temperature gradient in the vertical direction of the crucible while minimizing the temperature gradient in the radial direction at the crystal growth interface. The process also requires the temperature gradient profile to move upwards following the crystal growth interface. The temperature profile can be achieved by the use of multi-zone external graphite heaters or by changing the relative position of the crucible and heater in the vertical direction during crystal growth. The current approaches and systems suffer from the drawback that the systems and processes still result in thermal stresses generated from a radial temperature gradient at the crystal growth interface. This can cause increase crystal distortion, which results in lower crystal quality and yields.

SUMMARY

The present technology provides a heater configuration. In one aspect, the present technology provides a heater comprising a plurality of zones each defined by an electrode path disposed through a length of the heater, at least two zones having a variable power density gradient through the length of each zone, and the variable power density gradient of the at least two zones are different from one another.

In another aspect, the present technology provides a heater comprising an upper end; a lower end; a first electrode path having a length oriented vertically between the upper and lower end, the first electrode path having a first path width that varies over the length of its path; and a second electrode path having a length oriented vertically between the upper and lower end, the second electrode path having a second path width that varies over the length of its path; wherein the first electrode path has a first variable power density gradient, the second electrode path has a second variable power density gradient, and the first variable power density gradient is different from the second variable power density gradient.

In one aspect, the present technology provides a method of heating a material comprising (i) providing a heater proximate to a material to be heated, the heater comprising: an upper end; a lower end; a first electrode path having a length oriented vertically between the upper and lower end, the first electrode path having a first path width that varies over the length of its path; and a second electrode path have a length oriented vertically between the upper and lower end, the second electrode path having a second path width that varies over the length of its path; wherein the first electrode path has a first variable power density gradient, the second electrode path has a second variable power density gradient, and the first variable power density gradient is different from the second variable power density gradient; and (ii) forming a temperature gradient from the lower end of the heater to the upper end of the heater to heat the material by adjusting a power input supplied to the first and second electrode path; wherein the power input supplied to the first electrode path is different from the power input supplied to the second electrode path.

In one embodiment, a heater in accordance with one or more aspects of the technology can be a stand alone heater structure.

In one embodiment, a heater in accordance with one or more aspects of the technology is integral with a structure such as, for example, a container, and is provided as an electrode film on a surface of the container. In one embodiment, a heater in accordance with the present technology is provided as an electrode film on an outer surface of a crucible.

Heaters in accordance with the present technology can be employed in a variety of applications. In one embodiment, a heater in accordance with the present technology is suitable for use as a heater in a vertical gradient freeze process.

A heater with multiple zones having different variable power density gradients provides a heater that allows for control of the overall temperature and control of a temperature gradient for a particular application. The heaters also allow for more precise control and adjusting of the heat flux profile to the crucible surface. The heaters can provide control of the heating profile in both the vertical and radial directions. This can be beneficial in applications such as crystal growth processes.

These and other aspects of the technology are described and further understood with reference to the Figures and detailed description.

The drawings are not to scale unless otherwise noted. The drawings are for the purpose of illustrating aspects and embodiments of the present technology and are not intended to limit the technology to those aspects illustrated therein. Aspects and embodiments of the present technology can be further understood with reference to the following detailed description.

DETAILED DESCRIPTION

The present technology provides a heater design. The heater design provides a plurality of electrode paths, each path defining a zone having a power density gradient. At least two of the paths have a variable power density gradient that is different from each other. The heater allows for control of the temperature profile along the length of the heater by controlling the power applied to each of the zones.

The heater comprises a plurality of electrode paths disposed through a length of the heater, each path defining a zone having a power density gradient. The electrode paths can be provided such that a major portion of the path runs vertically or horizontally relative to the lower and upper end of the heater structure. In one embodiment, the electrode paths may be configured such that a major portion of the electrode path runs substantially along the vertical axis of the heater design.

The heater is provided such that at least two of the zones have a variable power density gradient. The variable power density gradient of an electrode path is provided by providing an electrode path that has a width that changes along the length of the electrode path. The power density is greater in areas having a narrower path width, and the power density is lower in areas having a wider path width. Increasing the width of the path from the lower end of the path/heater toward the upper end of the path provides a power density gradient that decreases from the lower end of the path/heater toward the upper end of the path/heater. Decreasing the width of the path from the lower end of the path/heater toward the upper end of the path provides a power density gradient that increases from the lower end of the path/heater toward the upper end of the path/heater.

Figure 1A:
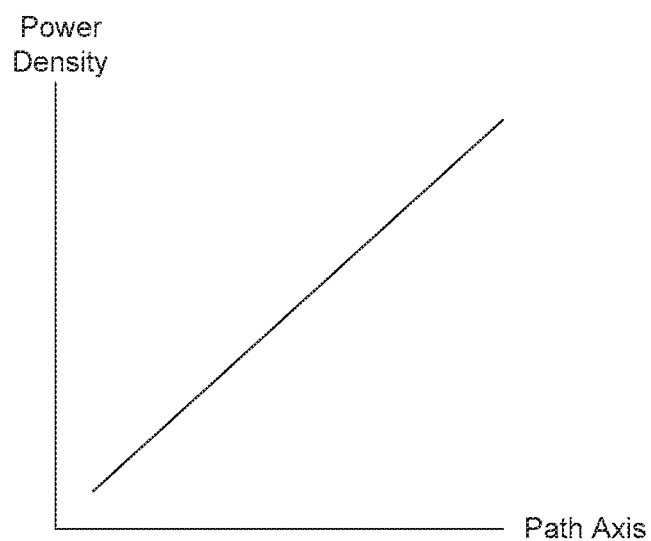
FIGS. 1A-1F illustrate examples of variable power density gradients that the electrode paths of a heater in accordance with the present technology may possess.
Figure 1B:
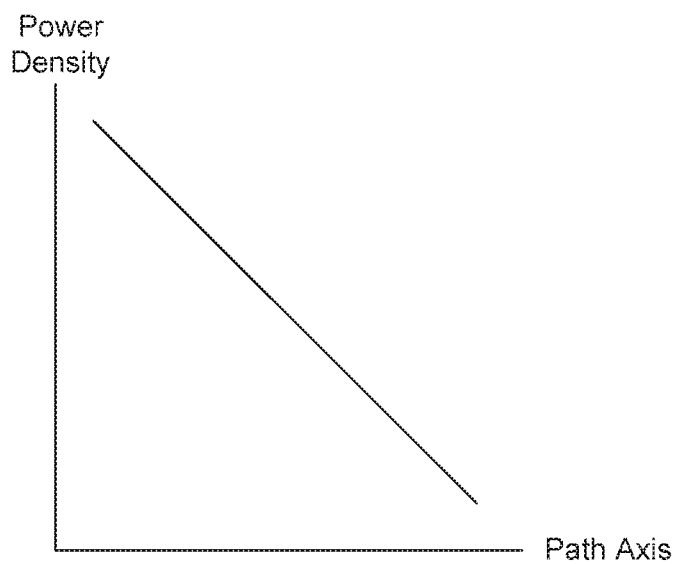
Figure 1C:
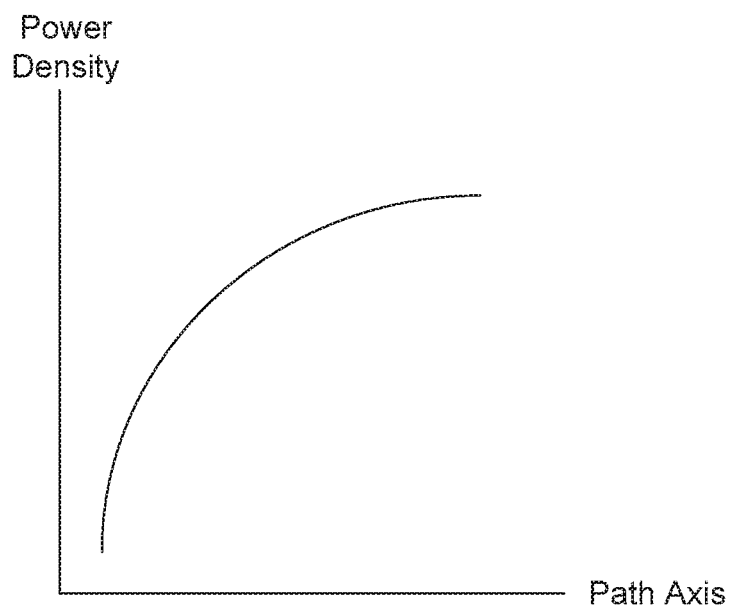
Figure 1D:
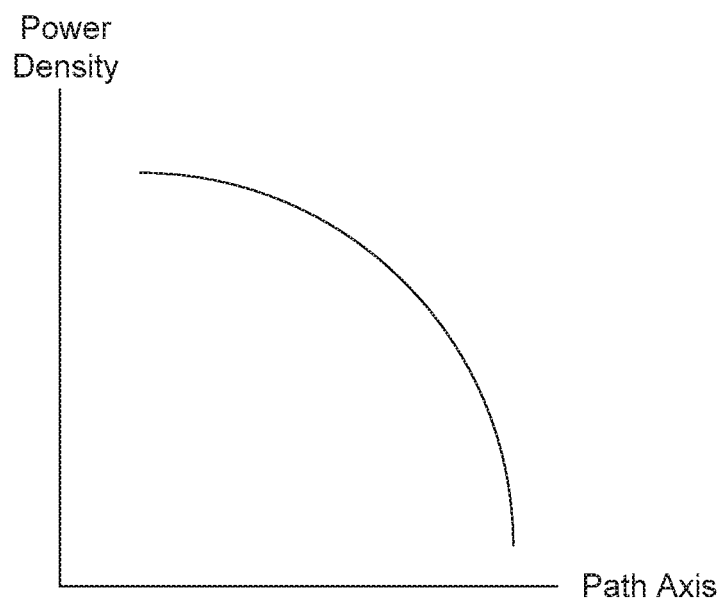
Figure 1E:
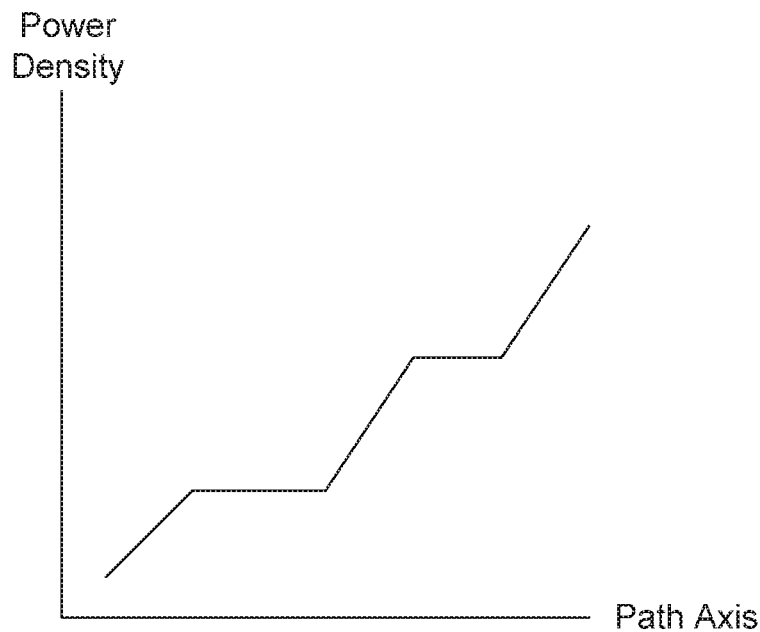
Figure 1F:
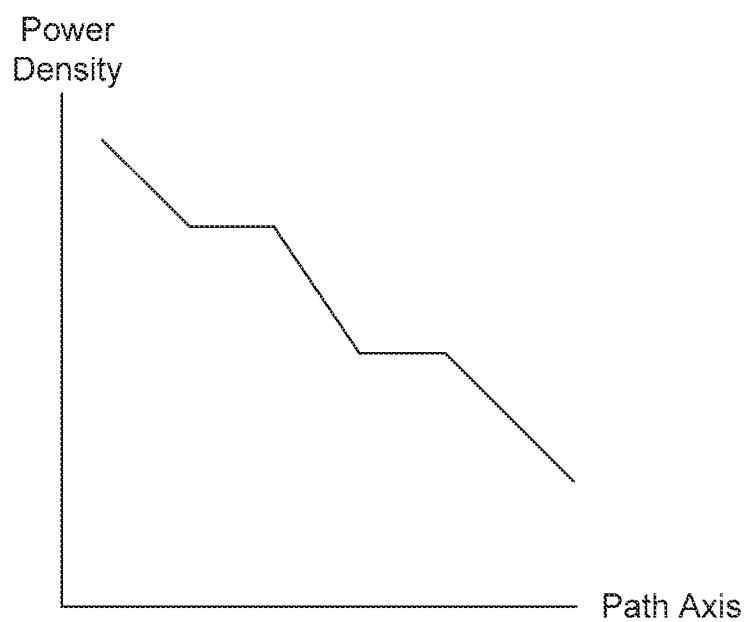

The slope of the power density gradient can be controlled or configured depending on the rate of change of the electrode path width over the length of the path. FIGS. 1A-1F illustrate examples of variable power density gradient curves that can be provided. The rate of change in the width of the path can be constant from the lower end of the path toward the upper end of the path to provide a relative linear power density gradient as illustrated in FIGS. 1A and 1B. In other embodiments, the rate of change in the width of the path does not have to be constant so as to provide a non-linear or curved power density gradient as illustrated in FIGS. 1C and 1D. In still another embodiment, the path width can be configured to provide a variable power density gradient having a step function as illustrated in FIGS. 1E and 1F. The power density gradient curves illustrated in FIGS. 1A-1F are only examples of possible variable density gradients that can be generated by adjusting the path width. It will be appreciated that other variable power density gradients having different slopes, curve shapes, step shapes, etc. can be created as desired.

In the heater design, at least two electrode paths are provided having different variable power density gradients. The variable power density gradients of each path can be selected as desired for a particular purpose or intended application. In one embodiment, the heater design comprises (a) a first electrode path having a variable power density gradient that increases from the lower end of the heater toward the upper end, and (b) a second electrode path having a variable power density gradient that decreases from the lower end of the heater toward the upper end of the heater. In another embodiment, the heater design comprises (a) a first electrode path having a variable power density gradient that decreases from the lower end of the heater toward the upper end, and (b) a second electrode path having a variable power density gradient that increases from the lower end of the heater toward the upper end of the heater. In yet another embodiment, the heater design comprises (a) a first electrode path having a variable power density gradient that increases from the lower end of the heater toward the upper end, and (b) a second electrode path having a variable power density gradient that increases from the lower end of the heater toward the upper end of the heater, where the variable power density gradient of the first electrode path is different from the variable power density gradient of the second electrode path. In still another embodiment, the heater design comprises (a) a first electrode path having a variable power density gradient that decreases from the lower end of the heater toward the upper end, and (b) a second electrode path having a variable power density gradient that decreases from the lower end of the heater toward the upper end of the heater, where the variable power density gradient of the first electrode path is different from the variable power density gradient of the second electrode path.

The temperature profile of the heater can be controlled and tuned by the design of the electrode paths defining the variable power density gradients and by the power supplied to each path. The power applied to a given path can range from 0% (i.e., the path is turned off) to 100% and any whole or fractional percentage in between. In one embodiment, the power applied to a given path can independently range from about 5% to about 95%; from about 10% to about 80%; from about 20% to about 80%; from about 30% to about 70%; even from about 40% to about 60%. Further, it will be appreciated that the total power applied to the paths does not have to equal 100%. The percentage of power applied to the respective paths refers to the percentage of the maximum power input specified for a given heater design. For example, if a heater has a power specification of 5 kW, then applying 100% power to a path would equate to applying a power of 5 kW to the path; 90% power would equate to 4.5 kW, etc. The power specification of a heater may depend on the size and design of the heater. Depending on the variable power density gradient of the respective paths, the temperature profile of the heater can be controlled by the power applied to each electrode path. Further, the power applied to the respective electrodes can be adjusted as desired to control the overall power density gradient and temperature of the heater. This allows for tuning the heating in a precise, controlled manner as may be required to meet a particular heating requirement for a given application.

Figure 2:
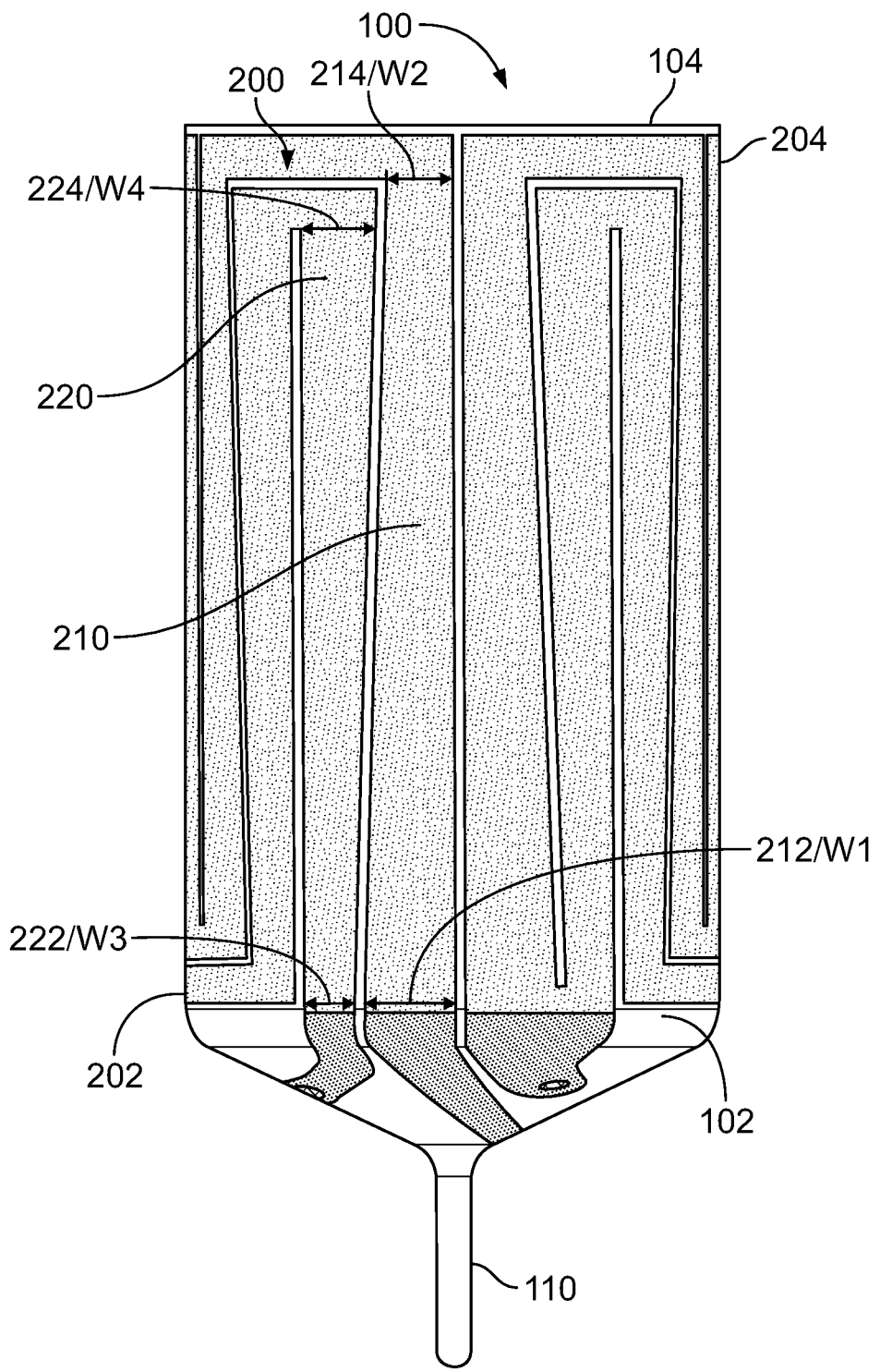
FIG. 2 is front view of a container comprising a heater design in accordance with an embodiment of the technology.
Figure 3:
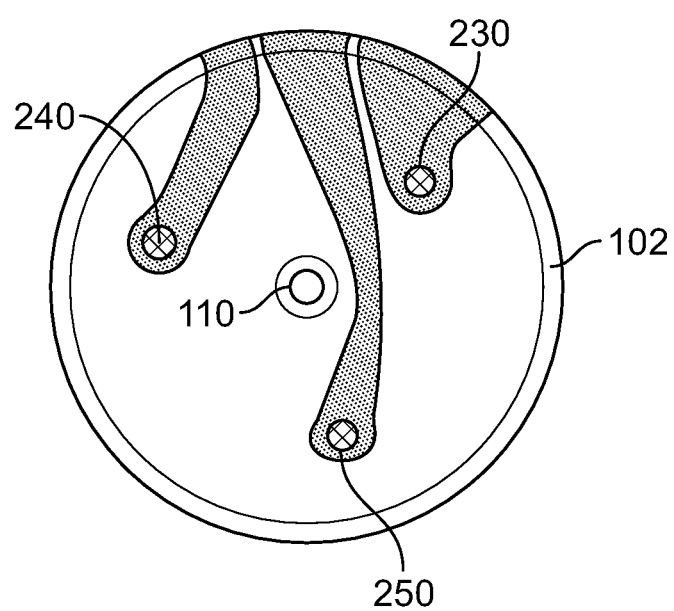
FIG. 3 is bottom view of the container of FIG. 2.
Figure 4:
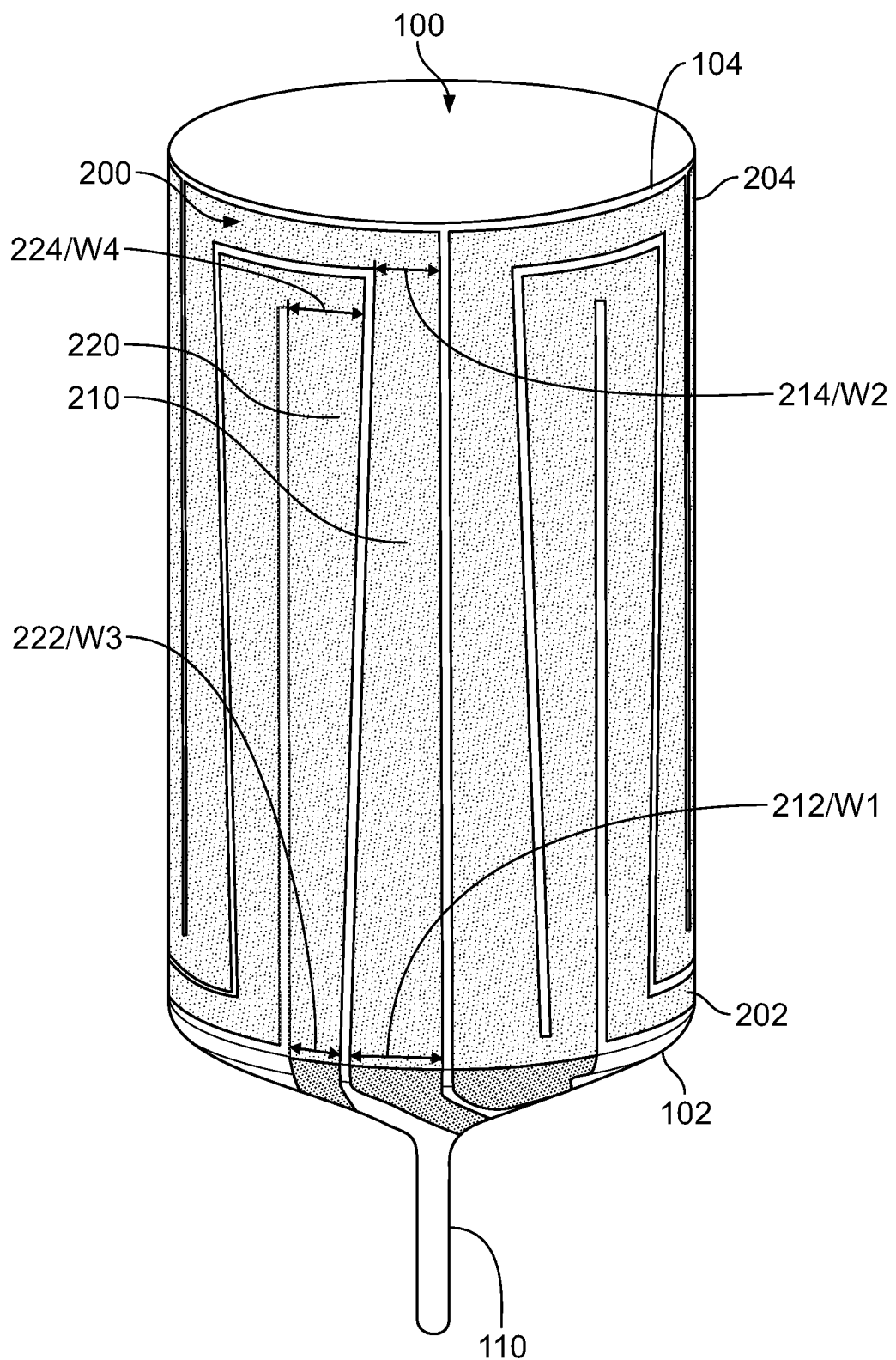
FIG. 4 is perspective view of the container of FIGS. 2 and 3.

FIGS. 2-4 illustrate an embodiment of a heater design in accordance with aspects and embodiments of the technology. In FIG. 2, the heater is provided as part of a system comprising a container 100 having an outer surface 102 and a heater design 200 disposed on the surface 102 of container 100. In the embodiment illustrated in FIG. 2, the container 100 is adapted for growing crystals such as by a vertical gradient freeze crystal growth process and includes a stem 110 where the seed crystal is disposed for promoting crystal growth. The heater design 200 in FIG. 2 includes electrode paths 210 and 220. The electrode paths 210 and 220 are parallel paths each having a major portion extending along the vertical axis of the container 100. The paths 210 and 220 each define a zone having a variable power density gradient. The respective variable power density gradients are defined by the change of the width of the respective electrode paths from the lower end 202 of the heater design toward the upper end 204 of the heater design. Path 210 is configured such that the path has a width $W_1$ at end 212 that is wider than width $W_2$ at end 214. Path 220 is configured such that the path has a lower end 222 with a width $W_3$ that is smaller than the width $W_4$ of end 224. Thus, in this arrangement, path 210 has a power density that increases from the lower end of the heater and container toward the upper end of the heater and container, and path 220 has a power density that decreases from the lower end of the heater and container toward the upper end of the heater and container.

The heater design includes terminals that include terminal contact areas 230, 240, and 250 to provide points of attachment to connect the heater zones to an electrical power source and provide an electrical current to the heater. Contact areas 230 and 250 can be used to power zone 210, and contact areas 230 and 240 can be used to power zone 220. The contact points can be positioned anywhere as desired. The contact terminals can also be provided in other shapes or as a flange, etc.

Figure 5:
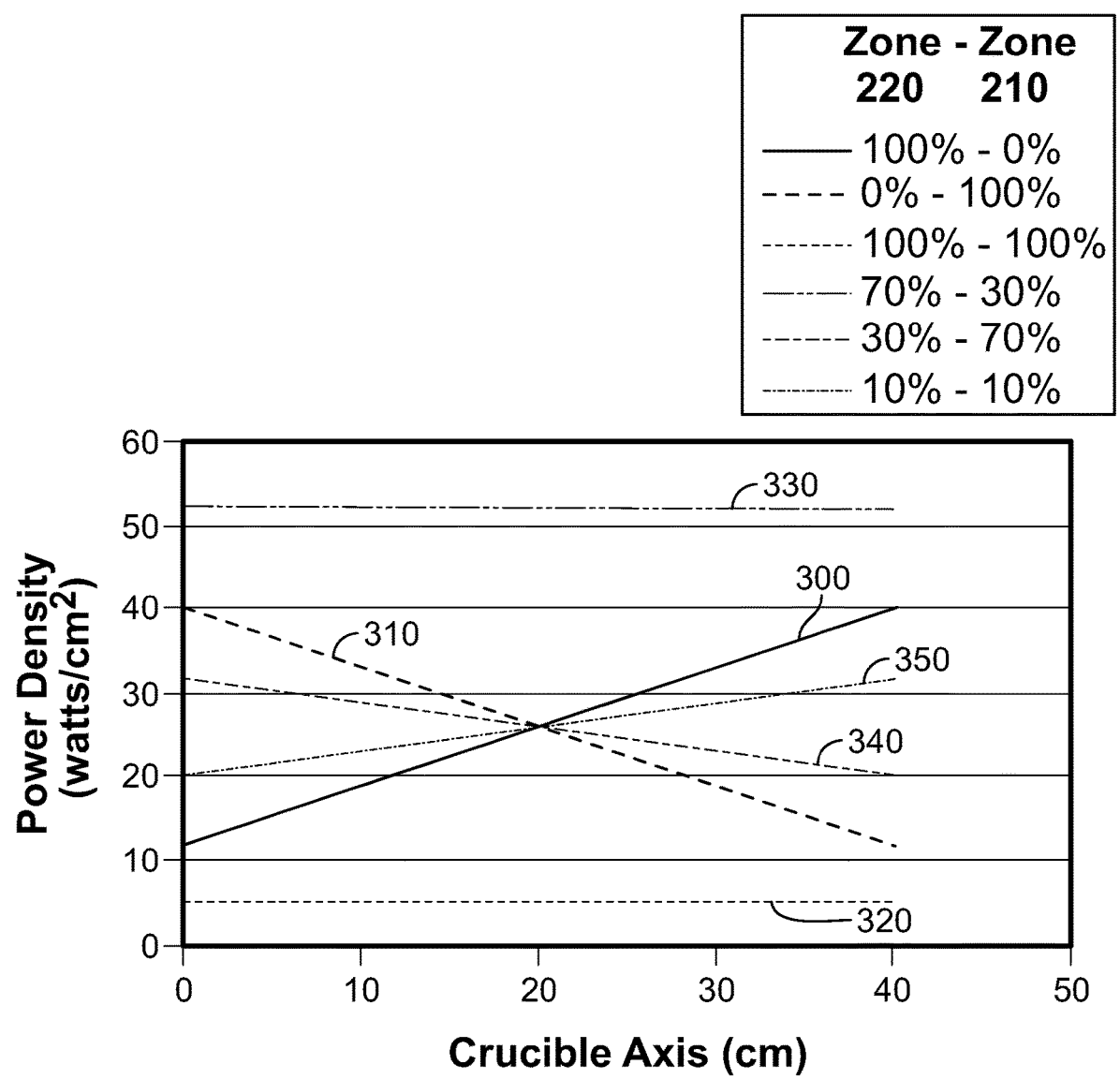
FIG. 5 is a graph illustrating power density combinations over the vertical axis of a container heated by a heater configuration in accordance with an embodiment of the technology.

FIG. 5 illustrates possible power density gradients for the heater based on the power applied to the respective electrode paths. At 100% power applied to electrode path 210 and 0% applied to path 220, i.e., electrode path 220 is turned off, the heater has a power density gradient defined by the power density gradient of path 210 illustrated by line 300. At 100% power applied to electrode path 220 and 0% applied to path 210, i.e., electrode path 210 is turned off, the heater has a power density gradient defined by the power density gradient of path 220 illustrated by line 310. In the embodiment illustrated in FIG. 2, the electrode paths have the same slope value but with different signs. Thus, when the same amount of power is applied to each path, the power density is flat along the axis of the heater and the container as demonstrated by lines 320 and 330. By adjusting the amount of power applied to the respective electrode paths, the power density and temperature profile of the heater can be adjusted or provided at any value in between the power density gradients of each bath by itself. Line 340 illustrates the power density gradient of the heater with the electrode 220 at 70% power and electrode 210 at 30% power. Line 350 illustrates the power density gradient of the heater with the electrode 210 at 70% power and electrode 220 at 30% power.

The embodiment illustrated by FIGS. 2-5 is merely an illustrative embodiment of a possible heater configuration. As previously described, the power density gradient of the respective electrode paths can be selected and configured as desired for a particular purpose or intended application. Further, the power density gradient of the heater can be controlled by the power applied to the respective paths.

The heater element can be provided as a stand alone heater structure or be provided as a film electrode applied to the surface of a substrate. For a stand alone heater, the heater body can be formed from any suitable material including, but not limited to, carbon, graphite, carbon-bonded carbon fiber, silicon carbide, a metal, e.g., a refractory metal, a refractory metal carbide, a refractory metal nitride, a refractory metal silicide, combinations of two or more thereof, etc. Examples of suitable metals include tungsten, molybdenum, rhenium, tantalum, platinum, alloys of two or more thereof, nitrides, carbides, and/or silicides thereof, etc.

The heater body may be provided with a coating layer to protect the body and provide corrosion resistance. The coating layer of the graphite body comprises one or more of a nitride, carbide, carbonitride or oxynitride of elements selected from a group consisting of B, Al, Si, Ga, refractory hard metals, transition metals, and rare earth metals, or complexes and/or combinations thereof. Examples include pyrolytic boron nitride (pBN), aluminum nitride, titanium aluminum nitride, titanium nitride, titanium aluminum carbonitride, titanium carbide, silicon carbide, and silicon nitride.

In a one embodiment, the coating layer comprises pBN. In a second embodiment, the coating layer comprises AlN. In a third embodiment, the coating layer comprises a complex of AlN and BN. In a fourth embodiment, the coating layer comprises a composition of pyrolytic boron nitride (PBN) and a carbon dopant in an amount of less than about 3 wt % such that its electrical resistivity is smaller than $10^{14}$ Ω-cm. In yet a fifth embodiment, the coating layer comprises an aluminum nitride wherein a small amount of $Y_2O_3$ is added, e.g. in amount of 5 wt % relative to 100 wt % of aluminum nitride. Both pBN and AlN have excellent insulating and conducting properties and can be easily deposited from the gaseous phase. They also have a high temperature stability. Additionally, they have a different color (white) than the pyrolytic graphite base (black) such that in the step of forming the electrical patterns, the coating layer can be easily visually distinguished from the patterns. In still another embodiment the coating can be silicon carbide (SiC). In yet another embodiment, the coating can be a tantalum carbide (TaC).

In one embodiment, the heating element comprises a film electrode deposited on the surface of a substrate to be heated, e.g., a container such as a crucible. The film electrode can be formed from any suitable for forming an electrode including carbon, graphite, carbon-bonded carbon fiber, silicon carbide, a metal, e.g., a refractory metal, a refractory metal carbide, a refractory metal nitride, a refractory metal silicide, combinations of two or more thereof, etc. Examples of suitable metals include tungsten, molybdenum, rhenium, tantalum, platinum, alloys of two or more thereof, nitrides, carbides, and/or silicides thereof, etc. The film electrode can have any desired thickness. In one embodiment, the film electrode has a thickness ranging from about 5 microns to about 250 µm. The film electrode can be formed by suitable processes including, but not limited to, screen-printing, spin coating, plasma spray, spray pyrolysis, reactive spray deposition, sol-gel, combustion torch, electric arc, ion plating, ion implantation, sputtering deposition, laser ablation, evaporation, electroplating, and laser surface alloying. In one embodiment, the film electrode comprises a metal having a high melting point, e.g., tungsten, molybdenum, rhenium and platinum or alloys thereof. In another embodiment, the film electrode comprises a noble metal or a noble metal alloy. In yet another embodiment, the electrode comprises pyrolytic graphite. A film electrode can also be provided with a coating layer covering the film layer to prevent corrosion or the undesirable reactions of the electrode material.

A heater or an apparatus having a heater printed thereon in accordance with aspects of the present technology may be suitable for use in a wide range of applications. The heater comprising a plurality of heater elements with different power density gradients are particularly suitable for applications where it is desirable to provide precise control of the heating profile and to allow for change of the heating profile by changing the power applied to the different heating zones or electrode paths. Applications where the heater or a container comprising the heater are suitable include, but are not limited to, molecular beam epitaxial applications, metal evaporation, thermal evaporation, solar cell growth, metal organic chemical vapor deposition (MOCVD), plasma enhanced chemical vapor deposition (PECVD), organometallic chemical vapor deposition (OMCVD), metal organic vapor phase epitaxy (MOVPE), vertical gradient freeze (VGF) crystal growth processes, etc.

In one embodiment, a heater design in accordance with the present technology is suitable for use in VGF crystal growth processes. The heater design can be used to grow any type of crystal as may be desired including, but not limited to, gallium arsenide (GaAs) crystals. In one embodiment, an apparatus for growing crystals comprises a crucible and a heater design in accordance with the present technology. The crucible is not particularly limited and can be chosen depending on the processing conditions and the crystal to be grown. In one embodiment, the crucible may be a pyrolytic boron nitride (PBN) crucible. The heater design having multiple heating zones with different power density gradients can be provided as a stand alone heater structure or can be printed onto the crucible. In FIGS. 2-4, for example, the container 100 can be a crucible such a PBN crucible. The seed crystal can be placed in the stem 110, and a liquid comprising the desired materials for forming the crystal can be placed in the body of the container. The container can then be heated using the heater design, which can be used to provide the desired temperature profile and gradient by controlling the power supplied to the respective electrode paths having the different power density gradients. It will be appreciated that the configuration of FIGS. 2-4 is only an example of a possible embodiment of a heater configuration or pattern. The pattern, power density gradients, and number of electrode paths can be chosen as desired.

The heater can be used alone or in combination with other heating elements. For example, with respect to VGF processes, a crucible comprising a heater structure in accordance with the present technology can be used for the process along with a separate, stand alone heater (e.g., a conventional radial heater system).

Embodiments of the invention have been described above and modifications and alterations may occur to others upon the reading and understanding of this specification. The claims as follows are intended to include all modifications and alterations insofar as they come within the scope of the claims or the equivalent thereof.

What is claimed is:

1. A heater comprising a substrate comprising pyrolytic boron nitride, and a heater pattern disposed on the substrate, wherein the heater pattern comprises a first zone defined by a first electrode path disposed through a length of the heater, and a second zone defined by a second electrode path disposed through a length of the heater, the first zone and the second zone are powered independently from each other, the first and second zones each having a variable power density gradient through the length of each zone, where the variable power density gradient of the first and second zones is different from one another, where each electrode path of the first and second zones comprises a generally vertical and parallel path comprising a width that varies along the length of the heater.

2. The heater of claim 1, wherein the first and second zones are oriented vertically in the heater.

3. The heater of claim 1, wherein the variable power density gradient of one of the first zone increases over the length of the zone, and the variable power density gradient of the second zone decreases over the length of the zone.

4. The heater of claim 1, wherein the variable power density gradient of the first and second zones increases over the length of each of the zones.

5. The heater of claim 1, wherein the variable power density gradient of the first and second zones decreases over the length of each of the zones.

6. The heater of claim 1, wherein the heater is a stand alone structure.

7. The heater of claim 1, wherein the electrode paths of the heater pattern are formed from a film disposed on a surface of a substrate.

8. A system comprising (a) the heater of claim 7, and optionally (b) an external heater disposed adjacent to the substrate.

9. A heater comprising:
a substrate comprising graphite coated with pyrolytic boron nitride;
an upper end;
a lower end; and
a heater pattern disposed on the pyrolytic boron nitride, the heater pattern comprising (i) a first electrode path having a length oriented vertically between the upper and lower end, the first electrode path having a first path width that varies over the length of its path; and (ii) a second electrode path have a length oriented vertically between the upper and lower end, the second electrode path having a second path width that varies over the length of its path; wherein the first zone and the second zone are powered independently from each other, the first electrode path has a first variable power density gradient, the second electrode path has a second variable power density gradient, the first variable power density gradient is different from the second variable power density gradient, and the first electrode path is generally parallel with the second electrode path.

10. The heater of claim 9, wherein the first variable power density gradient increases over the length of the path, and the second variable power density gradient decreases over the length of the path.

11. The heater of claim 9, wherein the first variable power density gradient increases over the length of the path, and the second variable power density gradient increases over the length of the path.

12. The heater of claim 9, wherein the first variable power density gradient decreases over the length of the path, and the second variable power density gradient decreases over the length of the path.

13. The heater of claim 9, wherein the heater further comprises a material chosen from carbon, graphite, carbon-bonded carbon fiber, silicon carbide, a metal, a metal carbide, a metal nitride, a metal silicide, or a combination of two or more thereof.

14. The heater of claim 9, wherein the heater is a stand alone structure.

15. The heater of claim 9, wherein the first and second electrode paths are formed from a film disposed on a surface of a substrate.

16. A method of making a crystalline material by a vertical-gradient freeze method comprising:
providing a crucible having a lower end and an upper end;
providing a heater adjacent to the crucible, the heater comprising a substrate comprising graphite coated with pyrolytic boron nitride and having a heater pattern disposed on a surface of the substrate, where the heater pattern comprises a first zone defined by a first electrode path disposed through a length of the heater, and a second zone defined by a second electrode path disposed through a length of the heater, the first and second zones are powered independently of each other, each of the first and second zones having a variable power density gradient through the length of each zone, where the variable power density gradient of the first and second zones is different from one another, and wherein each electrode path of the first and second zones comprises a generally vertical and parallel path comprising a width that varies along the length of the heater;

melting material for forming the crystalline material; and forming a temperature gradient from the lower end of the crucible to the upper end of the crucible to initiate crystal growth in the melted material by adjusting a power input supplied to the at least two zones having a variable power density gradient.

17. The method of claim 16, wherein the crystalline material is GaAs.

18. The method of claim 16, wherein the heater is a stand alone structure separate from the crucible.

19. The method of claim 16, wherein the heater is integral with the crucible.

20. The method of claim 19, wherein the heater is provided on a surface of the crucible in the form of a printed film.

21. A system comprising (a) the heater of claim 19, and optionally (b) an external heater disposed adjacent to the crucible.

22. A method of heating a material comprising:
(i) providing a heater proximate to a material to be heated, the heater comprising a heater comprising:
a substrate comprising graphite coated with pyrolytic boron nitride;
an upper end;
a lower end; and
a heater pattern disposed on the pyrolytic boron nitride, the heater pattern comprising (a) a first electrode path having a length oriented vertically between the upper and lower end, the first electrode path having a first path width that varies over the length of its path; and
(b) a second electrode path have a length oriented vertically between the upper and lower end, the second electrode path having a second path width that varies over the length of its path; wherein the first zone and the second zone are powered independently from each other, the first electrode path has a first variable power density gradient, the second electrode path has a second variable power density gradient, and the first variable power density gradient is different from the second variable power density gradient, and wherein the first electrode path is generally parallel with the second electrode path; and
(ii) forming a temperature gradient from the lower end of the heater to the upper end of the heater to heat the material by adjusting a power input supplied to each of the first and second electrode paths; wherein the power input supplied to the first electrode path is different from the power input supplied to the second electrode path.

* * * * *